United States Patent
Gaub et al.

(10) Patent No.: US 8,472,172 B2
(45) Date of Patent: Jun. 25, 2013

(54) CENTRAL SUBASSEMBLY FOR A FLEXIBLE EXPANDABLE AUTOMATION DEVICE

(75) Inventors: Gernot Gaub, Hockenheim (DE); Gerd Gloeckner, Heidelberg (DE); Andreas Wilmers, Heidelberg (DE); Deqiang Yang, Mannheim (DE); YongHui Su, Xiamen (CN); YiLing Wang, Xiamen (CN); YiQing Chen, Xiamen (CN)

(73) Assignee: ABB AG, Mannheim (DE)

( * ) Notice: Subject to any disclaimer, the term of this patent is extended or adjusted under 35 U.S.C. 154(b) by 823 days.

(21) Appl. No.: 12/619,885

(22) Filed: Nov. 17, 2009

(65) Prior Publication Data

US 2010/0134967 A1 Jun. 3, 2010

(30) Foreign Application Priority Data

Nov. 18, 2008 (DE) .................... 10 2008 058 060

(51) Int. Cl.
*H05K 5/00* (2006.01)
*H05K 7/00* (2006.01)
*H05K 7/14* (2006.01)

(52) U.S. Cl.
USPC ............ 361/679.09; 361/679.01; 361/679.02; 361/801; 361/740; 361/759

(58) Field of Classification Search
USPC ............... 361/681, 683, 679.01–679.09, 801, 361/804, 679.29, 679.55, 679.32, 679.43, 361/679.44, 679.58, 679.59, 728–732, 740, 361/759; 16/367, 337, 319, 344, 336, 302, 16/342, 282, 283, 308, 368, 379, 343, 330; 455/575.3, 550.1, 56
See application file for complete search history.

(56) References Cited

U.S. PATENT DOCUMENTS

| | | | |
|---|---|---|---|
| 5,519,573 A | 5/1996 | Cobb et al. | |
| 5,552,965 A | 9/1996 | Habegger | |
| 7,336,497 B2 | 2/2008 | Eusterholz et al. | |
| 2003/0201902 A1* | 10/2003 | Post et al. | 340/693.5 |
| 2004/0150959 A1* | 8/2004 | Sullivan | 361/728 |
| 2006/0128171 A1* | 6/2006 | Schmidt et al. | 439/61 |
| 2007/0293954 A1 | 12/2007 | Pfingsten | |

FOREIGN PATENT DOCUMENTS

| | | |
|---|---|---|
| DE | 38 38 353 A1 | 5/1990 |
| DE | 10 2004 056 363 A1 | 1/2006 |
| DE | 20 2006 006 615 U1 | 10/2006 |

OTHER PUBLICATIONS

European Search Report issued on Feb. 24, 2010 by the European Patent Office in corresponding European Application No. 09 01 2894.

* cited by examiner

*Primary Examiner* — Jayprakash N Gandhi
*Assistant Examiner* — Jerry Wu
(74) *Attorney, Agent, or Firm* — Buchanan Ingersoll & Rooney PC (57) ABSTRACT

The disclosure relates to a subassembly for an expandable automation device, which includes a housing which accommodates a central processing unit, a voltage supply, an interface for connecting external input and output modules, and internal input and output modules. The subassembly can include three electronic subassemblies which are each arranged on a separate carrier, a third carrier being arranged between a first carrier and a second carrier. The first carrier can be configured to accommodate the electronic subassembly of the central processing unit, the second carrier can be configured to accommodate the electronic subassembly of the internal input and output modules, and the third carrier can be configured to accommodate the electronic subassembly of the voltage supply and the interface for connecting external input and output modules.

20 Claims, 10 Drawing Sheets

CENTRAL SUBASSEMBLY FOR A FLEXIBLE EXPANDABLE AUTOMATION DEVICE

RELATED APPLICATIONS

This application claims priority under 35 U.S.C. §119 to German Patent Application No. 10 2008 058 060.0 filed in Germany on Nov. 18, 2008, the entire content of which is hereby incorporated by reference in its entirety.

FIELD

The disclosure relates to a central subassembly for a flexible expandable automation.

BACKGROUND INFORMATION

Commercially available expandable automation devices (also known as programmable logic controllers) or expandable automation devices described in patent documents can be adapted to a wide variety of automation tasks and, are used, for example, in the field of industrial automation technology and in the field of switching and control technology.

These automation systems can be constructed in modular form from a central subassembly, communication couplers and expansion modules. Known central subassemblies include different subassemblies such as a central processing unit (also referred to as a CPU), a voltage supply, an interface for connecting external input and output modules, and internal input and output modules.

Owing to different functional and mechanical designs of the individual subassemblies of the central subassembly, production of the central subassembly can be complicated and costly due, for example, to a plurality of soldering processes which are matched to one another in order to avoid destroying individual components in the subassemblies.

SUMMARY

A subassembly for an expandable automation device is disclosed, comprising: a housing which accommodates a central processing unit, a voltage supply, an interface for connecting external input and output modules, and internal input and output modules; three electronic subassemblies which are each arranged on one of a first carrier, a second carrier and a third carrier, wherein the third carrier is arranged between the first carrier and the second carrier, the first carrier being configured to accommodate an electronic subassembly of the central processing unit, the second carrier being configured to accommodate an electronic subassembly of the internal input and output modules, and the third carrier being configured to accommodate an electronic subassembly of the voltage supply and the interface for connecting external input and output modules.

BRIEF DESCRIPTION OF THE DRAWINGS

Exemplary embodiments and advantageous refinements, improvements and further advantages of the disclosure are to be described and explained in more detail using the exemplary embodiments illustrated in the following figures, in which.

DETAILED DESCRIPTION

Exemplary embodiments are directed to a central subassembly for a flexible expandable automation device in which the central subassembly can, for example, be produced in a simple and cost-effective manner.

An exemplary central subassembly according to the disclosure for a flexible expandable automation device includes a housing which accommodates different subassemblies, for example a central processing unit, a voltage supply, an interface for connecting external input and output modules, and internal input and output modules.

According to an exemplary embodiment of the disclosure, the central subassembly can be constructed from three electronic subassemblies which are each arranged on a separate carrier which is in the form of a printed circuit board. A first carrier is intended to accommodate the electronic subassembly of the central processing unit, a second carrier is intended to accommodate the electronic subassembly of the internal input and output modules and display means for the internal input and output modules, and a third carrier is intended to accommodate the electronic subassembly of the voltage supply and the interface for connecting external modules, for example external input and output modules. The third carrier having the electronic subassembly for supplying voltage to the central subassembly can be arranged between the first and second carriers.

The first and second carriers of the central subassembly can be mechanically and electrically connected to the third carrier. The carriers are, for example, soldered to one another for the purpose of mechanical and electrical connection; for example, the carriers are connected by means of soldered pins. This dispenses with the plug connection between the individual carriers and achieves better mechanical stability.

The carriers can be, for example, arranged essentially (e.g., ±10%) at right angles to one another, the third carrier which accommodates the voltage supply for the central subassembly and the interface for connecting the external input and output modules being arranged between the second carrier, which accommodates the internal input and output modules, and the first carrier which accommodates the central processing unit.

In one exemplary embodiment of the central subassembly, only the second and first carriers have connection elements, for example pluggable or solderable terminals, connector strips or terminal blocks, for example for connecting external signals from further external expansion modules which are in the form of input and output modules, for example. The plug connections between the three electronic subassemblies or carriers can be thus reduced since the carriers can be soldered to one another and the electrical connection between the carriers can be ensured without additional plug connections.

Owing to the components of the central processing unit which are situated on it, the first carrier is, according to an exemplary embodiment of the disclosure, in the form of a complex multilayer printed circuit board in comparison with the second and third carriers, and the number of layers in the first carrier is greater than the number of layers in the second and third carriers.

In one exemplary embodiment of the central subassembly, the Ethernet interface and/or an apparatus which can preferably, for example, be covered and is in the form of a slot for accommodating accessories which can be retrofitted is/are also provided on the first carrier. The accessories which can be retrofitted may be interchangeable printed circuit boards for further interface circuits, memory cards or for accommodating a real-time clock.

The display means which are situated on the first and second carriers and are intended to display the input and output modules are in the form of optical waveguides and are intended to focus the light and contactlessly transmit it to the front side of the central subassembly.

As a result of the simplified mechanical structure of the exemplary central subassembly with respect to the integration of the functionally different subassemblies on three carriers according to their functions, production of the central subassembly can be cost-effective since the electronic subassemblies arranged on the different carriers can be manufactured using the respective optimally suitable soldering process.

The multilayer printed circuit board (first carrier) which is fitted with the components for the central processing unit, for example a microcontroller, a memory and logic modules, is, for example, fitted with components on both sides and soldered in the SMD process or in combination with an additional selective soldering process for the connecting pins for mechanically and electrically connecting the printed circuit boards to one another.

Depending on the components used, the printed circuit board which accommodates the electronic subassembly of the internal input and output modules (second carrier) can be fitted with components on both sides and soldered in the SMD process, or can be fitted with components on one side and soldered in the SMD process and can be fitted with components on the other side and soldered in the wave soldering process, or can be fitted with components on two sides and soldered in the SMD process with additional selective soldering of the wired components.

Depending on the components used, the printed circuit board for the voltage supply and the interface for connecting external modules (third carrier) can be fitted with components on one or two sides and soldered in the SMD process. In contrast, wired components and the connections between all three printed circuit boards can be processed using a wave soldering process.

Figure 1:
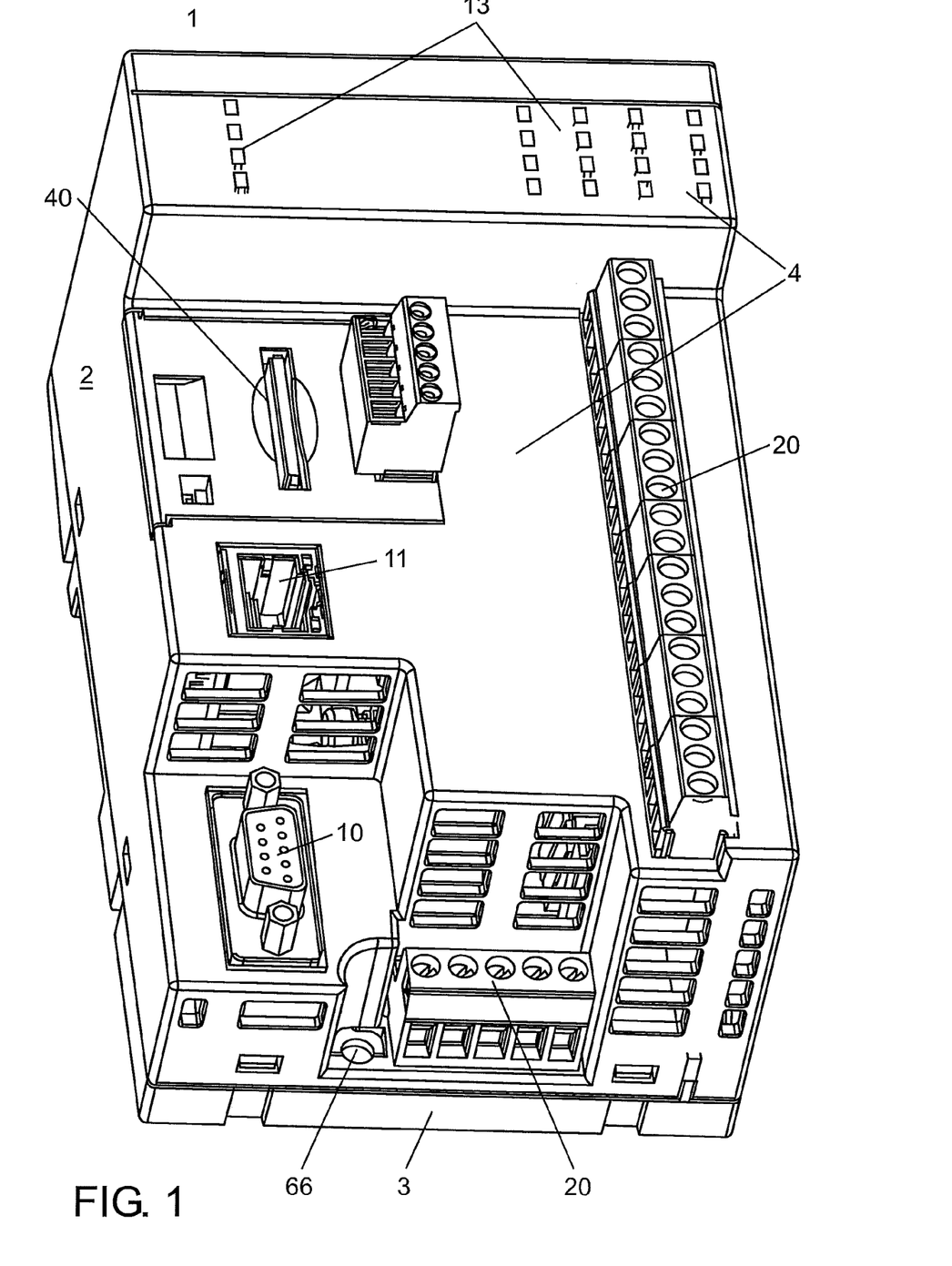
FIG. 1 shows an exemplary design of a central subassembly for a flexible expandable automation device.

FIG. 1 shows an exemplary design of a central subassembly 1 for a flexible expandable automation device for controlling and/or monitoring a technical process, the subassembly having a housing 2, on the housing lower part 3 of which the electronic subassembly for supplying voltage to the central subassembly 1 is arranged, and a housing front side 4.

A serial interface 10, an Ethernet interface 11, an apparatus 40 which can, for example, be covered and be in the form of a slot for accommodating accessories which can be retrofitted as well as connection elements 20, can be arranged on the housing front side 4.

The apparatus 40 which can be covered and has slots can accommodate interchangeable printed circuit boards for further interface circuits, for example for an additional serial interface, and can be provided as a socket for memory cards and/or can accommodate a printed circuit board for a real-time clock.

The housing front side 4 also can have display means 13 for displaying the input and output modules, which means can be in the form of optical waveguides. The optical waveguides can focus the light at a defined point and contactlessly transmit it to the front side 4 of the central subassembly 1. The light focused in the optical waveguides used can thus advantageously output the light only at one point on the front side 4 of the central subassembly 1.

In one exemplary embodiment of the central subassembly 1, the latter can be configured for wall mounting. For this purpose, the third printed circuit board and the housing lower part 3 can be provided with at least one aperture 66 which is intended to accommodate fastening means, for example screws, for wall mounting.

Figure 2:
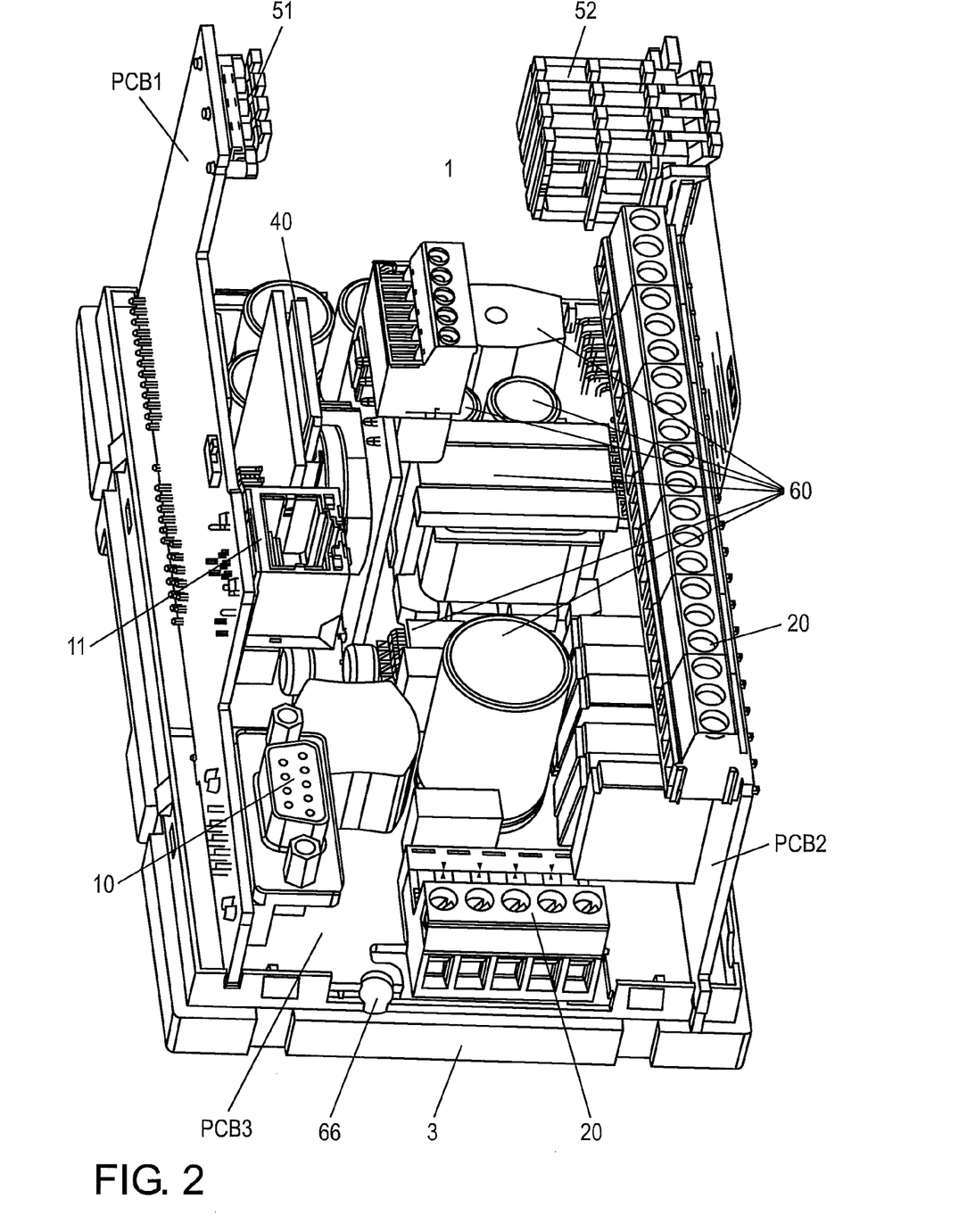
FIG. 2 shows an exemplary design of printed circuit boards in the central subassembly with the electronic subassemblies arranged thereon.

FIG. 2 shows an exemplary design of printed circuit boards PCB1, PCB2, PCB3 in central subassembly 1 with electronic subassemblies arranged thereon for a central processing unit, a voltage supply 60, an interface for connecting external input and output modules, and internal input and output modules.

The three electronic subassemblies of the central subassembly 1 are each arranged on a separate printed circuit board PCB1, PCB2, PCB3. According to an exemplary embodiment of the disclosure, the third printed circuit board PCB3 having the voltage supply 60 for the central subassembly 1, which is opposite the device front side 4 of the central subassembly 1, is arranged on the housing lower part 3 between the first printed circuit board PCB1 and the second printed circuit board PCB2.

The printed circuit boards PCB1, PCB2, PCB3 can be arranged essentially at a right angle to one another. The third printed circuit board PCB3 which accommodates the voltage supply 60 and further connection elements 20 for connecting the external input and output modules can be arranged between the first printed circuit board PCB1, and the second printed circuit board PCB2 which accommodates the internal input and output modules. The printed circuit board PCB1 can accommodate the central processing unit, the apparatus for accommodating accessories 40 which can be retrofitted, connection elements 20 and the Ethernet interface 11.

As a multilayer printed circuit board of complex construction, the first printed circuit board PCB1 can, for example, have six layers, whereas the second printed circuit board PCB2 which, for example, comprises four layers can be produced in a more cost-effective manner.

The display means 13 can include a first optical waveguide 51 and a second optical waveguide 52 respectively formed on the first and second printed circuit boards PCB1, PCB2 in the central subassembly 1. A detailed illustration of an exemplary display means is shown, by way of example, in FIG. 5.

Figure 3:
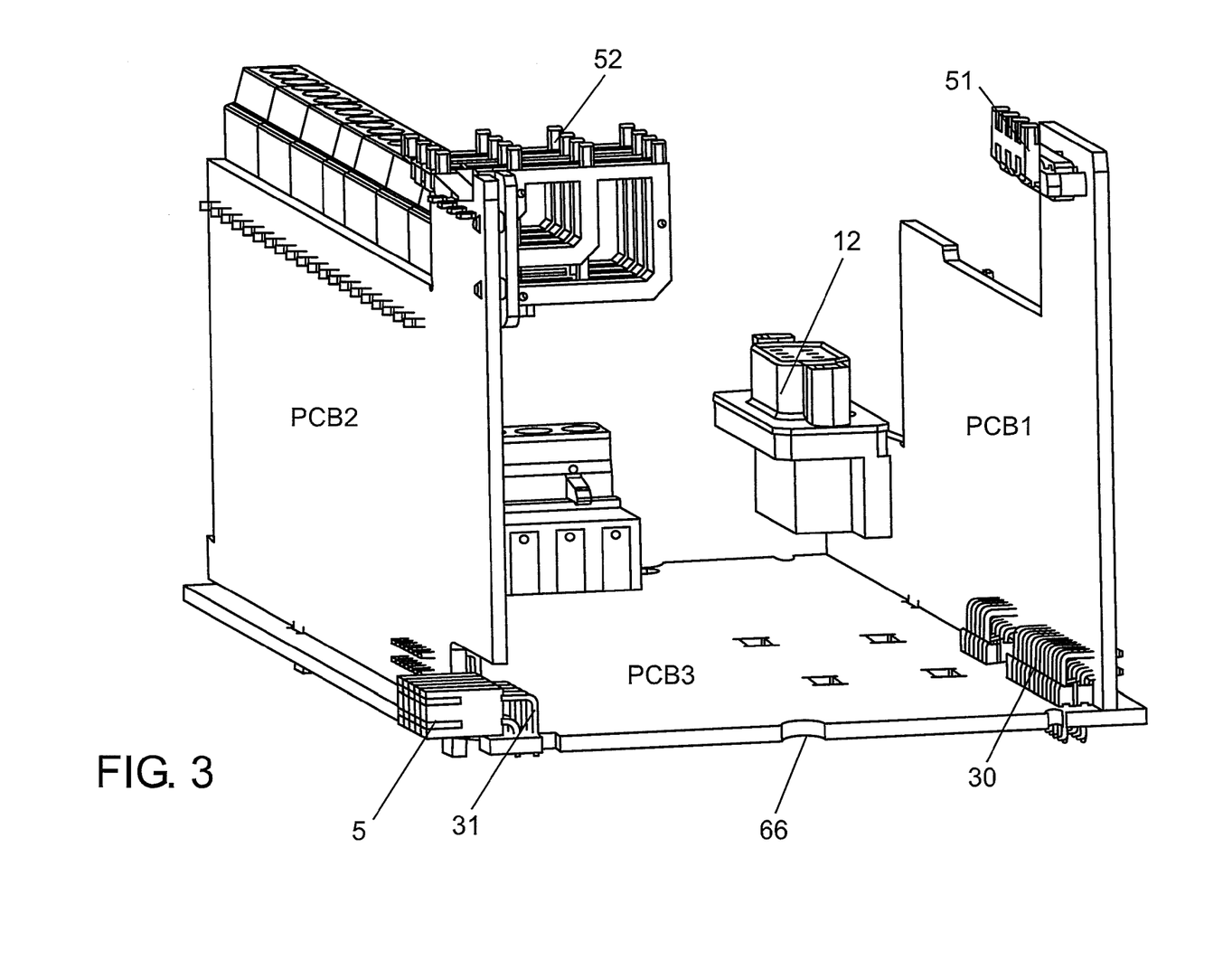
FIG. 3 shows an exemplary solution for connecting the printed circuit boards to one another.

FIG. 3 shows an exemplary electrical and mechanical connection 30 of the printed circuit boards PCB1, PCB2, PCB3 in the central subassembly 1 which are at right angles to one another, the arrangement of the optical waveguides 51, 52 on the first and second printed circuit boards PCB1, PCB2 as well as a plug element 12 for a communication interface and a plug connector 5 for an input/output bus.

In order to connect the printed circuit boards PCB1, PCB2, PCB3 to one another, the first and second printed circuit boards PCB1, PCB2 have, in an exemplary embodiment, a multiplicity of bent pins 31 which are guided through openings provided in the third printed circuit board PCB3 and are soldered, for example by a wave soldering process.

The printed circuit boards PCB1, PCB2, PCB3 can be electrically connected by means of the solder pins labelled with the reference symbol 31.

The previously described electrical and mechanical connection 30, 31 of the printed circuit boards PCB1, PCB2, PCB3 arranged in the central subassembly 1 can dispense with expensive plug connections and achieve better mechanical stability.

The aperture 66 for accommodating fastening means for mounting the central subassembly 1 on a wall is also shown, by way of example, on the third printed circuit board PCB3.

Figure 4:
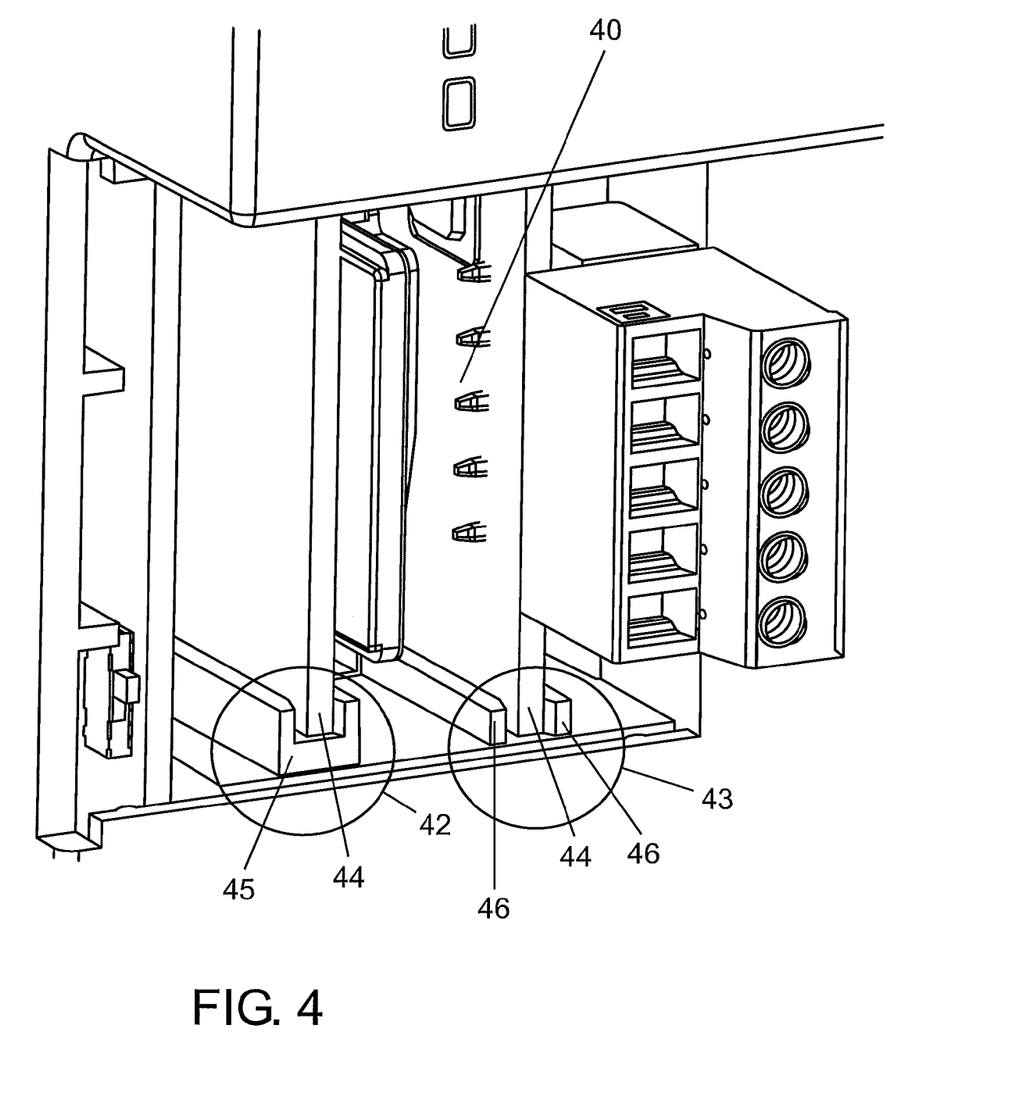
FIG. 4 shows an exemplary embodiment of an apparatus, which is situated on a first printed circuit board, as a slot for accommodating accessories which can be retrofitted.

FIG. 4 shows an exemplary embodiment of the apparatus 40, which can be covered and is situated on the first printed circuit board PCB1, as a slot for accommodating at least one printed circuit board 44 which can be retrofitted, the printed circuit board 44 being provided, for example, for additional interfaces, memory cards and/or being intended to accommodate a real-time clock.

In a first exemplary embodiment 42 of the apparatus 40, the printed circuit board 44 which can be retrofitted can be inserted, for example, into a socket which is formed from a U-shaped rail 45.

In another exemplary embodiment 43, the apparatus 40 for accommodating the printed circuit board 44 which can be retrofitted is formed from two elongated elements 46 which are in the form of rails and between which the printed circuit board 44 which can be retrofitted is inserted.

In order to accommodate the printed circuit board 44, the elongated cuboidal elements 46 or the U-shaped rail 45 can be bevelled or rounded at their/its inner ends inclined towards the printed circuit board 44 to be inserted in order to thus facilitate the accommodation of the printed circuit board 44.

Figure 5:
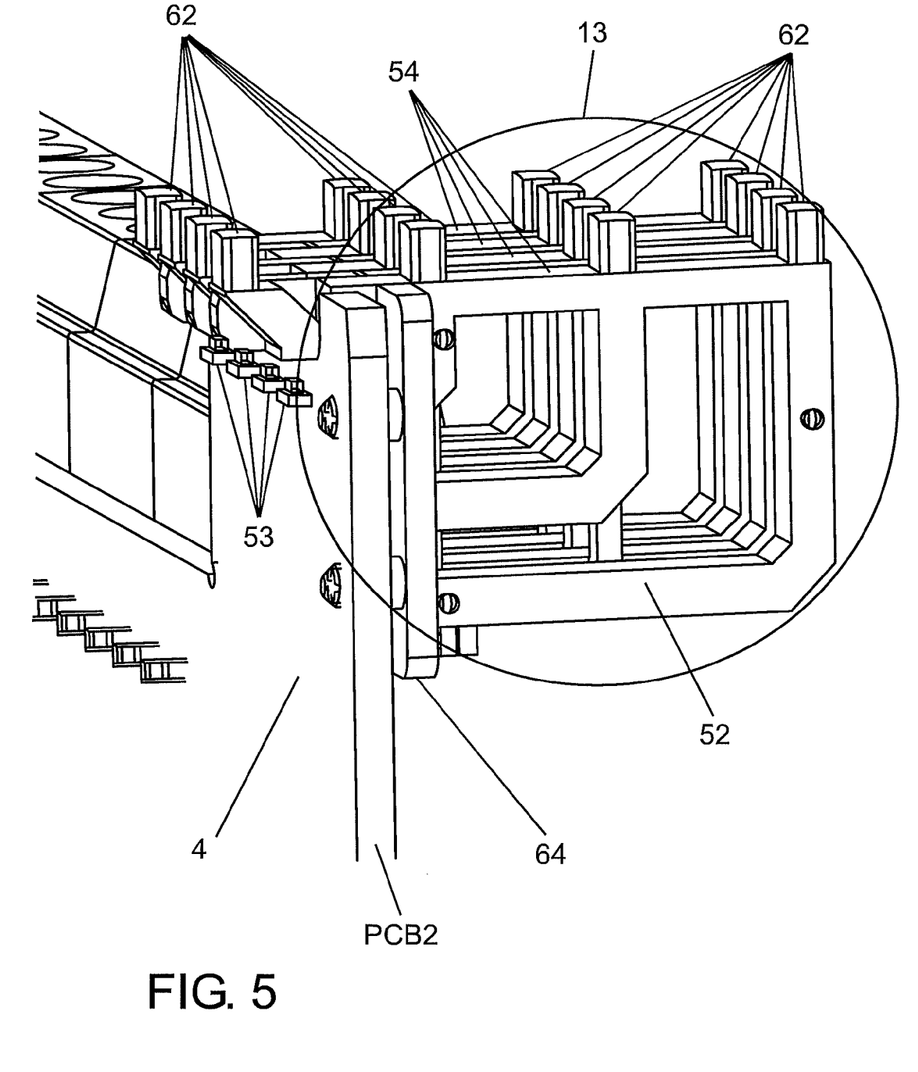
FIG. 5 shows an exemplary design of a display of a central subassembly, which is arranged on a second printed circuit board.

FIG. 5 shows an exemplary design of a display means 13 of the central subassembly 1, which means is, for example, arranged on the second printed circuit board PCB2. The display means 13 is formed by the second optical waveguide 52 which focuses the light generated by optical display elements 53, for example, light-emitting diodes (also see FIG. 9), and contactlessly transmits it to the exit openings 62. A cover 64 holds the second optical waveguide 52 constructed from four identical parts 54 together and prevents crosstalk between the individual strands of the second optical waveguide 52.

The second optical waveguide 52 may be constructed from a plurality of identical optical waveguide parts 54 arranged behind one another and may be configured in such a manner that simple and cost-effective injection moulds can be used to produce it. An exemplary design of the optical waveguides 51, 52 can be gathered from FIG. 9.

Figure 6:
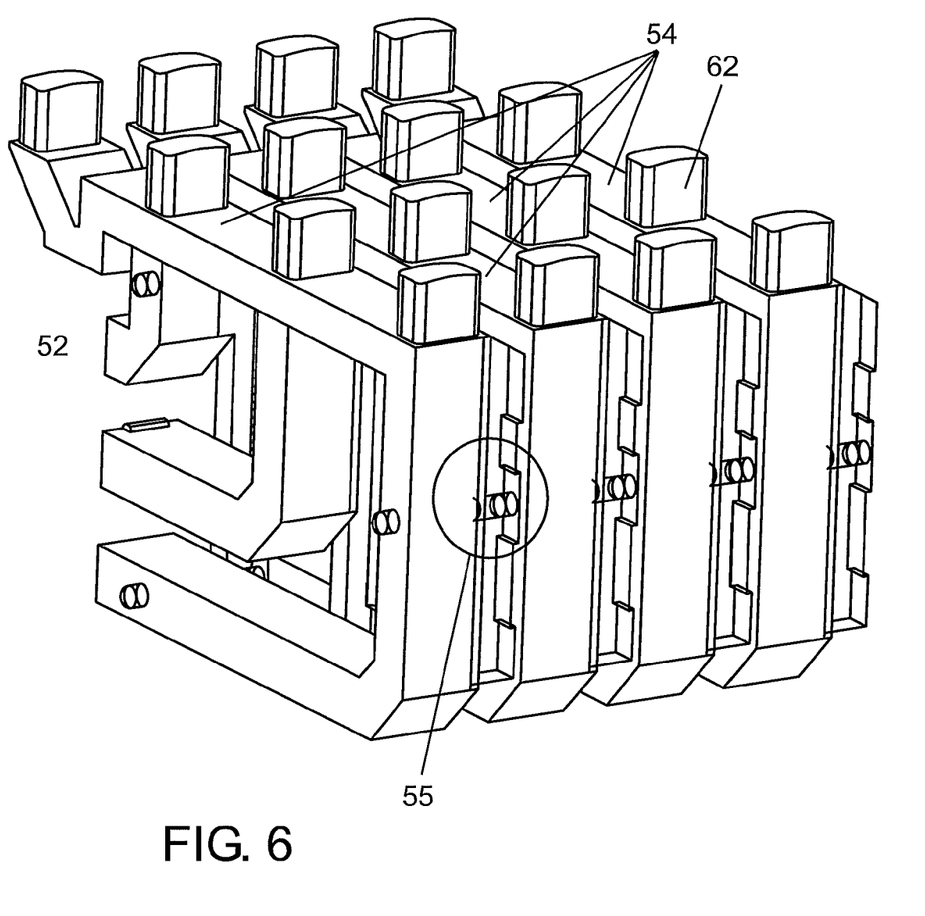
FIG. 6 shows an exemplary tenon/hole connection of exemplary identical parts which have been stacked on top of one another.

The identical parts 54 are arranged, for example, by stacking the identical parts 54 on top of one another, and the identical parts can be, for example, connected by means of a tenon/hole connection 55. An exemplary tenon/hole connection 55 of identical parts 54 which have been stacked on top of one another is shown in FIG. 6.

Figure 7:
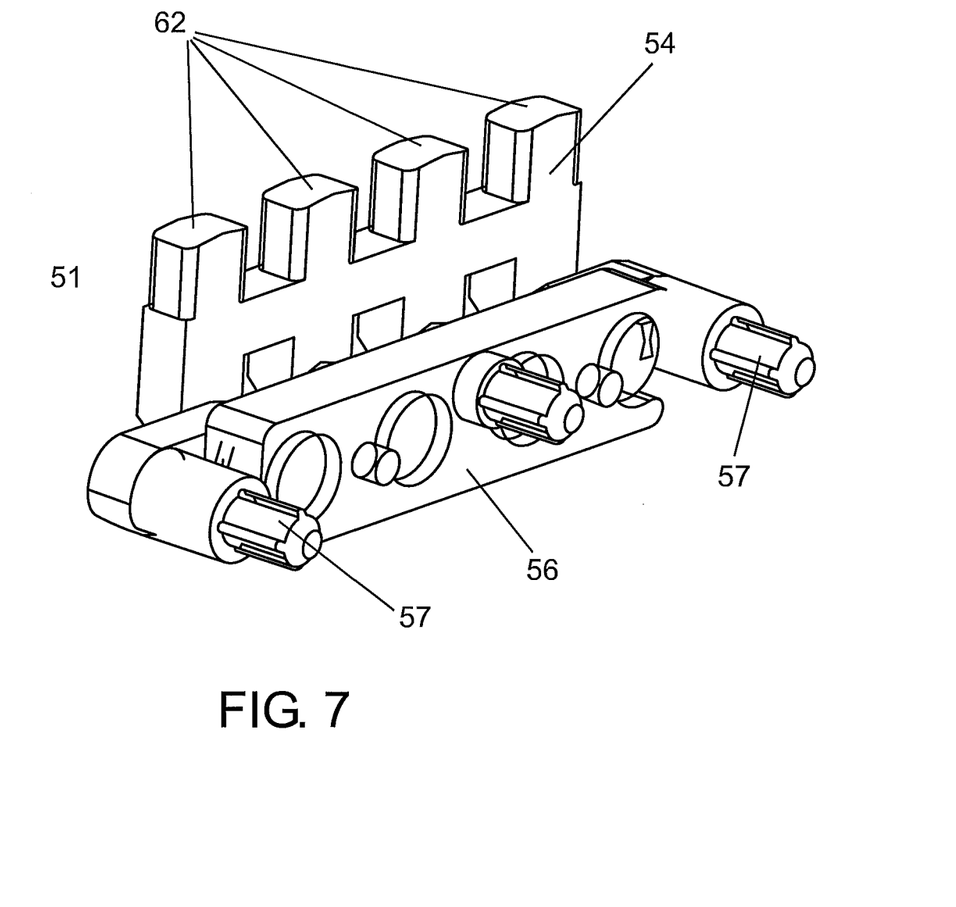
FIG. 7 shows an exemplary design of a display arranged on a first printed circuit board.

FIG. 7 shows an exemplary first optical waveguide 51 which is arranged on the first printed circuit board PCB1, the light generated by optical display elements 53 also being focused by the first optical waveguide 51 and the light focused by the first optical waveguide 51 being transmitted from the display elements 53 to light exit surfaces 62 at a central point on the front side 4 of the central subassembly 1.

According to an exemplary embodiment, the first optical waveguide 51 is constructed from an identical part 54 and a carrier 56 which accommodates the identical part 54. The carrier 56 can form, together with the identical part 54, a multiple optical waveguide which generates a plurality of light points. Furthermore, the carrier 56 may also have connecting elements 57 for fastening the optical waveguide 51 to the printed circuit board PCB1. The carrier 56 can prevent crosstalk between the individual strands of the optical waveguide 54.

Figure 8:
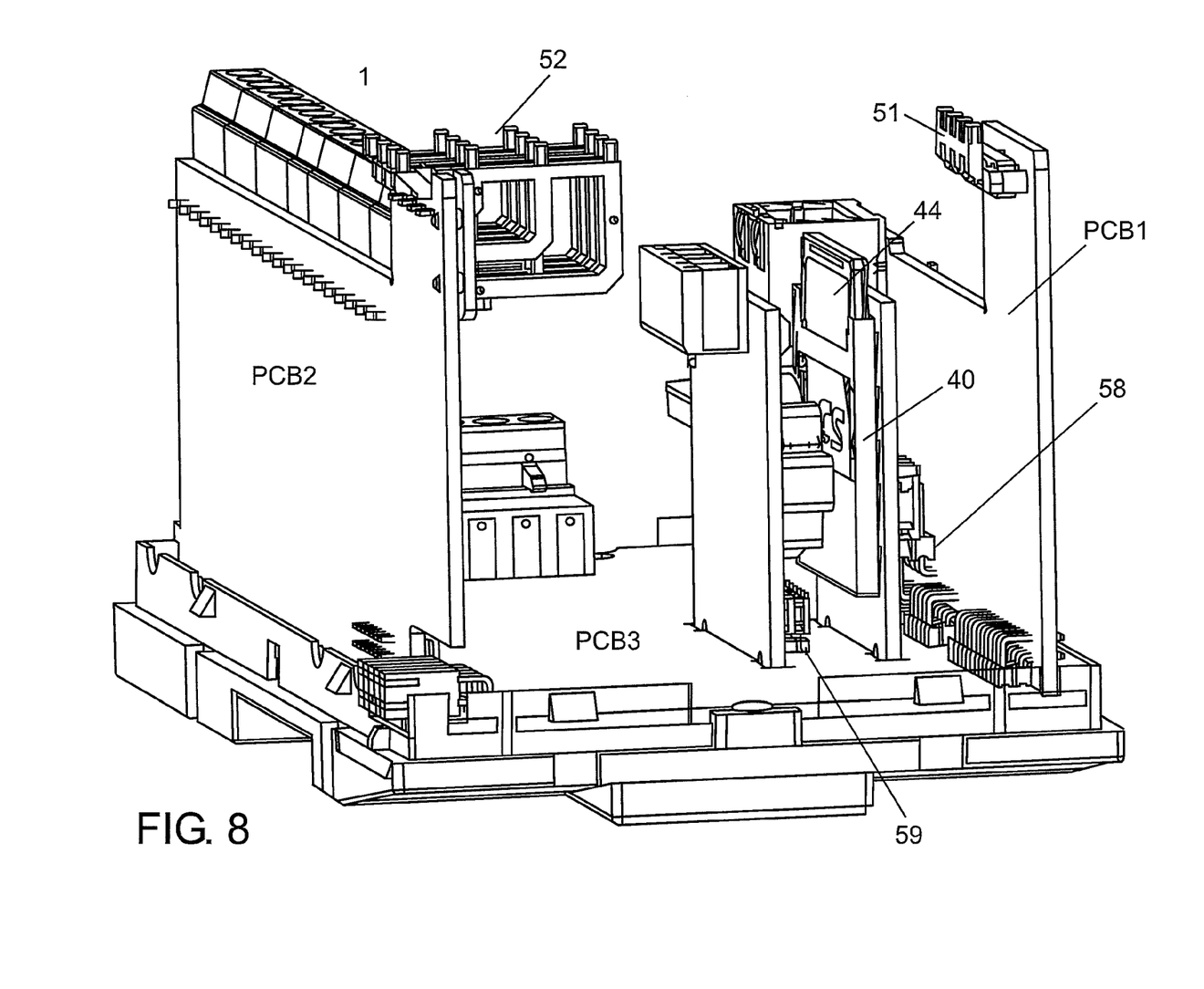
FIG. 8 shows an exemplary design for accommodating accessories which can be retrofitted and an exemplary design of slots for accommodating the latter.

FIG. 8 shows an exemplary design for accommodating 40 the accessories 40 which can be retrofitted in the central subassembly 1 with the slots for accommodating accessories on the first or third printed circuit board PCB1, PCB3. The plug elements 58, 59 for connecting the accessories 44 which can be retrofitted, for example a communication interface or a real-time clock, on the first printed circuit board PCB1 or the third printed circuit board PCB3 are labelled with the reference symbols 58 and 59.

Figure 9:
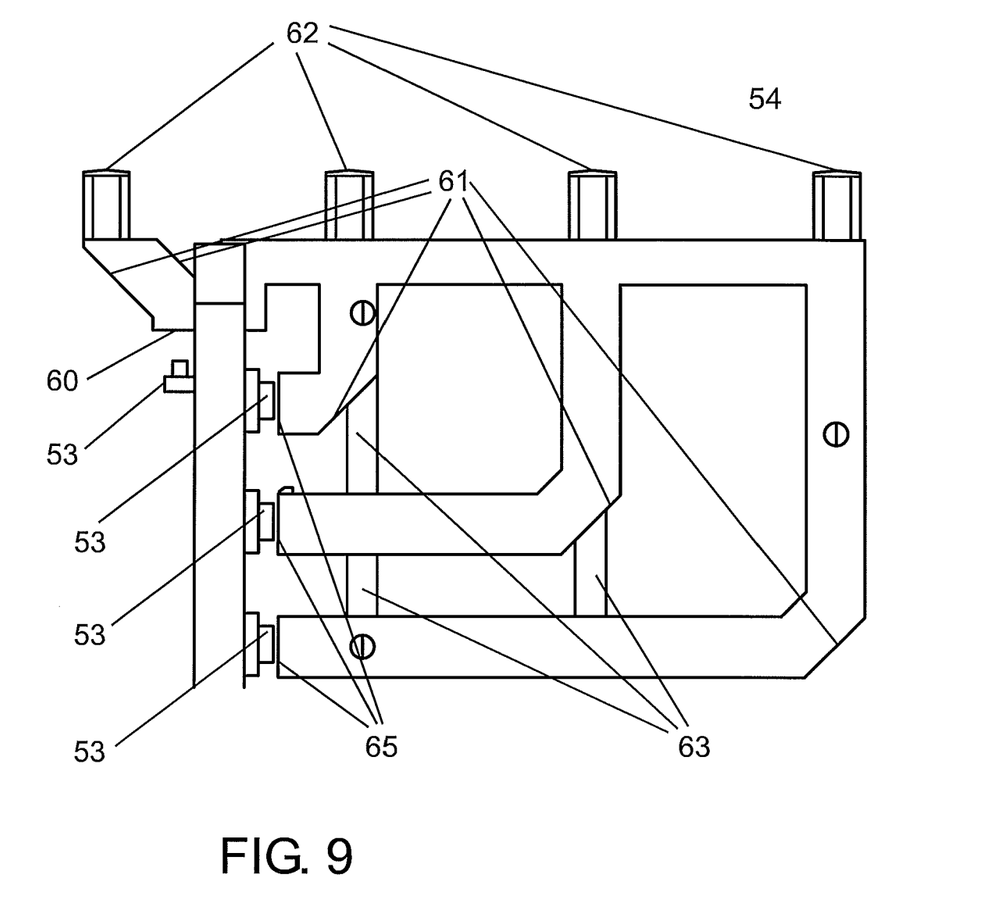
FIG. 9 shows an exemplary refinement of an identical part of an optical waveguide.

FIG. 9 illustrates an exemplary sectional illustration of an identical part 54 of the optical waveguide and illustrates the design of the identical part 54 which is used as the first optical waveguide 51. The identical part 54 includes four individual optical waveguide strands. The identical part can be stiffened by means of webs 63.

The light generated by the optical display elements 53 enters via entry surfaces 65 of the identical part 54, is then reflected at the surfaces 61 by means of total internal reflection and exits at the exit openings or in the surfaces 62.

Figure 10:
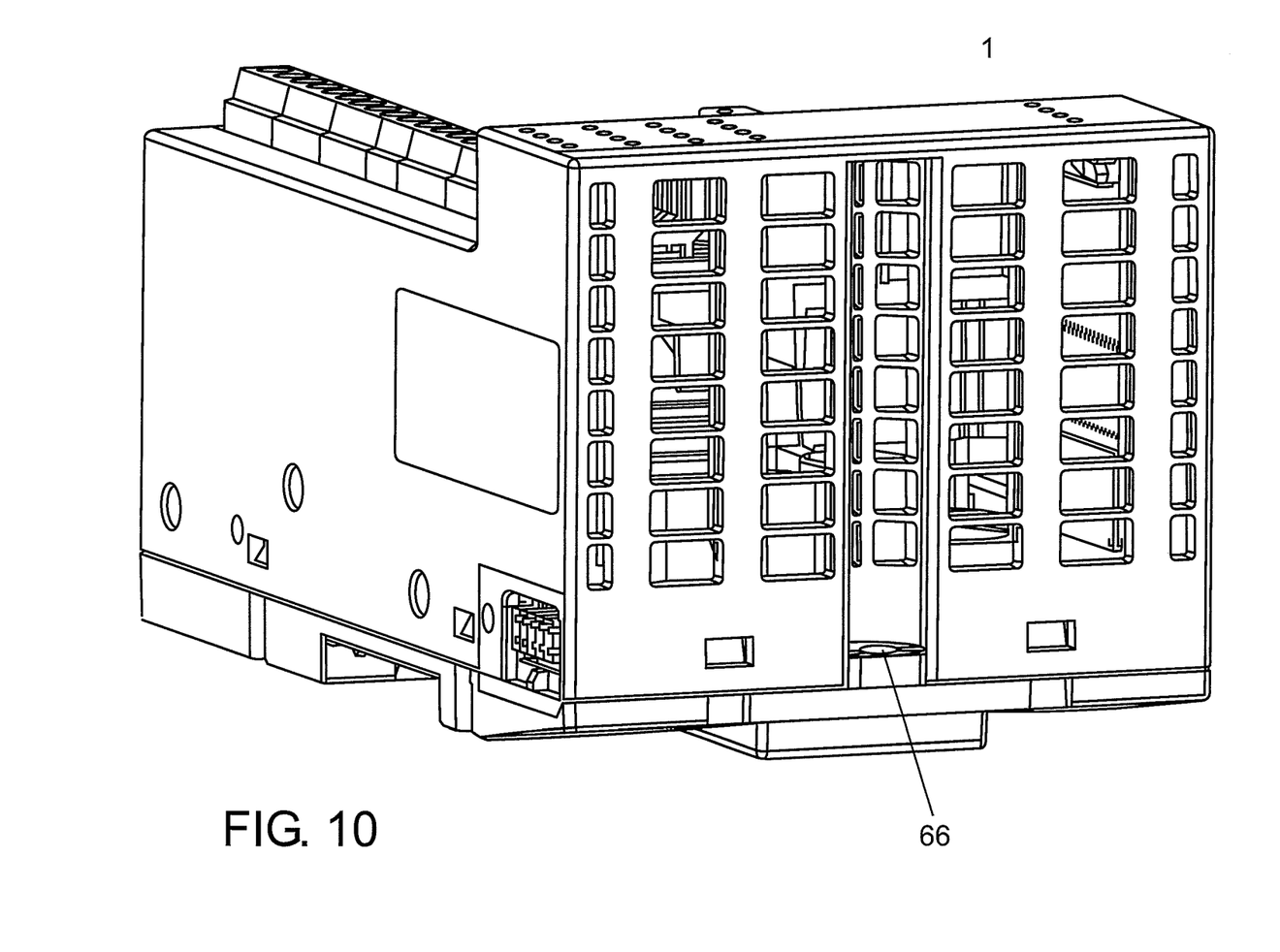
FIG. 10 shows a central subassembly having an exemplary aperture for wall fastening by screws.

FIG. 10 shows an exemplary central subassembly 1 and the aperture 66 for fastening the subassembly 1 to a wall by means of screws.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

1 Central subassembly
2 Housing
3 Housing lower part
4 Housing front side
5 Plug connector for input/output bus
10 Serial interface
11 Ethernet interface
12, 58, 59 Plug element for connecting accessories which can be retrofitted
13 Display means
20 Connection elements
30 Connection of the carriers to one another
31 Pins
40 Apparatus in the form of a slot for accommodating accessories which can be retrofitted
41 Opening for accommodating additional printed circuit boards
42 First embodiment for accommodating an additional printed circuit board
43 Second embodiment for accommodating an additional printed circuit board
44 Additional printed circuit board
45 Socket, U-shaped rail
46 Elongated cuboidal element
51 First optical waveguide 52 Second optical waveguide
53 Display element
54 Identical part of the optical waveguide
55 Tenon/hole connection
56 Carrier
57 Connecting element
60 Voltage supply
61 Reflection surface
62 Exit opening, exit surface
63 Web
64 Cover
65 Entry opening
66 Aperture
PCB1 First carrier for accommodating the electronic subassembly of the central processing unit
PCB2 Second carrier for accommodating the electronic subassembly of the internal input and output modules
PCB3 Third carrier for accommodating the electronic subassembly of the voltage supply and the interface for connecting external input and output modules

What is claimed is:

1. A subassembly for an expandable automation device, comprising:
a housing which accommodates a central processing unit, a voltage supply, an interface for connecting external input and output modules, and internal input and output modules;
three electronic subassemblies which are each arranged on one of a first carrier, a second carrier and a third carrier, wherein the third carrier is arranged between the first carrier and the second carrier, the first carrier being configured to accommodate an electronic subassembly of the central processing unit, the second carrier being configured to accommodate an electronic subassembly of the internal input and output modules, and the third carrier being configured to accommodate an electronic subassembly of the voltage supply and the interface for connecting external input and output modules; and
display means formed as optical waveguides for focusing light generated by optical display elements and for contactless transmitting the light to a front side of the subassembly, the optical waveguides being arranged only on the first and second carriers.

2. Subassembly according to claim 1, wherein the first and second carriers are mechanically and electrically connected to the third carrier.

3. Subassembly according to claim 1, wherein the first, second and third carriers are soldered to one another for electrical and mechanical connection.

4. Subassembly according to claim 1, wherein the first, second and third carriers are arranged essentially at right angles to one another, the third carrier being arranged between the first carrier and the second carrier.

5. Subassembly according to claim 1, wherein the first and second carriers have pluggable or solderable terminals for connecting external signals.

6. Subassembly according to claim 1, wherein the first carrier is a multilayer printed circuit board which is of greater complexity as compared with the second and third carriers, and wherein a number of layers in the first carrier is greater than a number of layers in the second and third carriers.

7. Subassembly according to claim 1, wherein the first carrier has an Ethernet interface.

8. Subassembly according to claim 1, wherein the first carrier has a serial interface.

9. Subassembly according to claim 1, wherein the first carrier has a slot for accommodating accessories which can be retrofitted.

10. Subassembly according to claim 1, wherein the optical waveguides focus the light generated by the optical display elements to a defined point.

11. A subassembly for an expandable automation device, comprising:
a housing which accommodates a central processing unit, a voltage supply, an interface for connecting external input and output modules, and internal input and output modules;
three electronic subassemblies which are each arranged on one of a first carrier, a second carrier and a third carrier, wherein the third carrier is arranged between the first carrier and the second carrier, the first carrier being configured to accommodate an electronic subassembly of the central processing unit, the second carrier being configured to accommodate an electronic subassembly of the internal input and output modules, and the third carrier being configured to accommodate an electronic subassembly of the voltage supply and the interface for connecting external input and output modules; and
display means formed as optical waveguides, which focuses light generated by optical display elements arranged on only the first and second carriers, and wherein the optical waveguides transmit the light to a front side of the subassembly.

12. Subassembly according to claim 11, wherein the optical waveguides focus the light generated by the optical display elements to a defined point.

13. Subassembly according to claim 11, wherein the first and second carriers are mechanically and electrically connected to the third carrier.

14. Subassembly according to claim 11, wherein the first, second and third carriers are soldered to one another for electrical and mechanical connection.

15. Subassembly according to claim 11, wherein the first, second and third carriers are arranged essentially at right angles to one another, the third carrier being arranged between the first carrier and the second carrier.

16. Subassembly according to claim 11, wherein the first and second carriers have pluggable or solderable terminals for connecting external signals.

17. Subassembly according to claim 11, wherein the first carrier is a multilayer printed circuit board which is of greater complexity as compared with the second and third carriers, and wherein a number of layers in the first carrier is greater than a number of layers in the second and third carriers.

18. Subassembly according to claim 11, wherein the first carrier has an Ethernet interface.

19. Subassembly according to claim 11, wherein the first carrier has a serial interface.

20. Subassembly according to claim 11, wherein the first carrier has a slot for accommodating accessories which can be retrofitted.

* * * * *